(12) United States Patent
Wegmann et al.

(10) Patent No.: US 7,286,245 B2
(45) Date of Patent: Oct. 23, 2007

(54) METHOD AND APPARATUS FOR DETERMINING THE INFLUENCING OF THE STATE OF POLARIZATION BY AN OPTICAL SYSTEM; AND AN ANALYSER

(75) Inventors: Ulrich Wegmann, Koenigsbronn (DE); Michael Hartl, Munich (DE); Markus Mengel, Heidenheim (DE); Manfred Dahl, Lauchheim (DE); Helmut Haidner, Aalen (DE); Martin Schriever, Aalen (DE); Michael Totzeck, Schwaebisch Gmuend (DE)

(73) Assignee: Carl Zeiss SMT AG, Oberkochen (DE)

( * ) Notice: Subject to any disclaimer, the term of this patent is extended or adjusted under 35 U.S.C. 154(b) by 395 days.

(21) Appl. No.: 10/628,431

(22) Filed: Jul. 29, 2003

(65) Prior Publication Data

US 2004/0114150 A1    Jun. 17, 2004

(30) Foreign Application Priority Data

Jul. 29, 2002   (DE) .............................. 102 355 14
Jan. 31, 2003   (DE) .............................. 103 04 822

(51) Int. Cl.
*G01B 9/02* (2006.01)
(52) U.S. Cl. ............... 356/521; 356/491; 356/494; 356/520
(58) Field of Classification Search ................ 356/495, 356/515, 520, 521, 491, 494; 478/36
See application file for complete search history.

(56) References Cited

U.S. PATENT DOCUMENTS

| | | | |
|---|---|---|---|
| 4,732,483 A | * | 3/1988 | Biegen ................. 356/495 |
| 4,762,417 A | * | 8/1988 | Wu et al. ............. 356/477 |
| 4,798,468 A | * | 1/1989 | Ohuchi ................ 356/495 |
| 5,166,752 A | | 11/1992 | Spanier et al. |
| 5,227,623 A | | 7/1993 | Heffner |

(Continued)

FOREIGN PATENT DOCUMENTS

DE          101 09 929 A1     11/2001

(Continued)

OTHER PUBLICATIONS

"Optical Shop Testing", Edited by:Daniel Malacara, John Wiley & Sons, Inc., Second Edition, pp. 112-113, 1992, USA.

(Continued)

*Primary Examiner*—Gregory J. Toatley, Jr.
*Assistant Examiner*—Michael A Lyons
(74) *Attorney, Agent, or Firm*—Sughrue Mion, PLLC (57) ABSTRACT

A method and an apparatus for determining the influencing of the state of polarization of optical radiation by an optical system under test, wherein radiation with a defined entrance state of polarization is directed onto the optical system, the exit-side state of polarization is measured, and the influencing of the state of polarization is determined by the optical system with the aid of evaluation of the exit state of polarization with reference to the entrance state of polarization. An analyser arrangement which can be used for this purpose is also disclosed. The method and the apparatus are used, e.g., to determine the influencing of the state of polarization of optical radiation by an optical imaging system of prescribable aperture, the determination being performed in a pupil-resolved fashion.

21 Claims, 6 Drawing Sheets

U.S. PATENT DOCUMENTS

| | | | |
|---|---|---|---|
| 5,298,972 | A | 3/1994 | Heffner |
| 5,396,329 | A | 3/1995 | Kalawsky |
| 5,815,268 | A * | 9/1998 | LaFleur .................. 356/515 |
| 5,965,874 | A | 10/1999 | Aso et al. |
| 6,061,133 | A * | 5/2000 | Freischlad ............... 356/460 |
| 6,204,924 | B1 | 3/2001 | Cyr |
| 6,312,373 | B1 | 11/2001 | Ichihara |
| 6,344,898 | B1 | 2/2002 | Gemma et al. |
| 2002/0024673 | A1 | 2/2002 | Ouchi |
| 2002/0044287 | A1 * | 4/2002 | Otaki ..................... 356/521 |

FOREIGN PATENT DOCUMENTS

| | | |
|---|---|---|
| EP | 0 396 409 A2 | 11/1990 |
| EP | 0 439 127 A2 | 7/1991 |
| JP | 11-142291 A | 5/1999 |
| WO | WO 02/42728 A1 | 5/2002 |
| WO | WO 03/028073 A1 | 4/2003 |

OTHER PUBLICATIONS

Michael I. Shribak et al, "Return-Path Polarimeter for Two Dimensional Birefringence Distribution Measurement", Jul. 1999, SPIE, pp. 144-145 and 148-149, vol. 3654, Denver Colorado.

S. Berezhna, et al., "Accuracy of Whole-Field Mapping by Jones Matrix Fourier Photopolarimeter", 2000, Proceedings of SPIE, pp. 81-89, vol. 4148.

* cited by examiner

METHOD AND APPARATUS FOR DETERMINING THE INFLUENCING OF THE STATE OF POLARIZATION BY AN OPTICAL SYSTEM; AND AN ANALYSER

The following disclosure is based on German Patent Application No. 102 35 514.2 filed on Jul. 29, 2002 and German Patent Application No. 103 04 822.7 filed on Jan. 31, 2003, which are incorporated into this application by reference.

BACKGROUND OF THE INVENTION

1. Field of the Invention

The invention relates to a method for determining the influencing, caused by an optical system, of the state of polarization of optical radiation to an aberration correction method and to an apparatus, suitable for carrying out such a method, and to a polarization analyser arrangement which can be used in the latter.

2. Description of the Related Art

Various methods and apparatuses are known which can be used to determine how an optical system influences the state of polarization of optical radiation. The term optical system is to be understood in this case as any arrangement of one or more optical components which transmit and/or reflect the incident optical radiation, in particular including lenses and objectives constructed therewith. The term optical radiation is to be understood here as any desired electromagnetic radiation which is applied to the optical system under test, for example visible light or UV radiation. Particularly widely used are ellipsometry methods and ellipsometry apparatuses in diverse forms. In order to describe the state of polarization and how it is influenced or changed by the optical system, use is made of suitable variables such as the Stokes parameters, the Muller matrix, the polarization matrix and the Jones matrix. Reference may be made to the relevant literature for details in this regard.

A method and an apparatus of the type mentioned at the beginning are disclosed in Patent Specification U.S. Pat. No. 5,298,972. In this method and in this apparatus the influencing of the state of polarization caused by an optical system is determined in an integral fashion, specifically by determining a single set of Stokes parameters, assigned to the optical system under test, and determining the Jones matrix resulting therefrom. The radiation is directed via a single-mode fibre in each case onto the optical component and diverted by the latter, the result being to effect spatial beam filtering.

It is also known to utilize polarization effects to produce polarization images of objects. The Patent Specification U.S. Pat. No. 5,396,329 indicates a corresponding image recording system which, in addition to an imaging optics, has an optical retarder, for example in the form of a compensator, and, downstream thereof, a linear polarizer which are both arranged rotatively. Serving as image detection unit is, for example, an imaging camera, a CCD detector or a row of individual detector elements. The computational evaluation is performed via the Stokes parameters and one Muller matrix for each polarization-relevant component.

The Patent Specification U.S. Pat. No. 5,166,752 discloses an ellipsometry system in which a parallel entrance bundle is focused onto an optical system under test such that the individual rays are incident at various angles, and the light cone reflected or transmitted by this optical system under test is refocused into a parallel exit beam. Serving as detector unit is a row of individual detector elements which are struck in each case by light rays which originate from a narrow range of angles of incidence on the optical system under test. The aim of this is to permit simultaneous detection of the state of polarization of light rays incident on the system under test at various angles of incidence without an attendant requirement for a scanning detection operation. This ellipsometry system is used, in particular, to test optical materials for properties which cause a change in state of polarization, specifically the birefringence of an optical volumetric material in the case of transmission measurement.

As is known, it is possible for the purpose of determining the image quality of optics which image with high precision to make use of wavefront sensors with the aid of which deviations of the image-side wavefronts from the ideal imaging behaviour can be determined very accurately. So-called shearing interferometers, for example, are in use for this purpose. A wavefront detection device based thereon is disclosed in Laid-Open Specification DE 101 09 929 A1. This apparatus is also suitable, in particular, for determining the image quality of projection objectives of microlithographic projection exposure machines, and includes means for providing a wavefront source, for example with an optical conductor and a perforated mask arranged at the output thereof, in the object plane of the optical imaging system under test and a diffraction grating in the image plane conjugate to the object plane. Connected downstream of the diffraction grating is a spatially resolving radiation detector, for example in the form of a CCD chip, an interposed optics imaging the interferogram produced by the diffraction grating onto the sensor surface of the detector. This type of wavefront sensor technology can test the imaging system with the aid of the same radiation which is used by the imaging system in its normal operation, and it can be integrated in one component with the imaging system. This type of wavefront sensor is therefore also denoted as an operational interferometer (OI).

In the German Patent Application 102 17 242.0, which is not a prior publication, a measuring apparatus is described which can, in particular, be such an OI apparatus and serves the purpose of interferometric measurement of an optical imaging system which is used for imaging a useful pattern, provided on a mask, into the image plane, the mask being arranged in the object plane for this purpose. It is proposed to implement the wavefront source from the interferometric measurement by means of a measuring pattern formed on the mask in addition to the useful pattern.

A further method, used in practice, of wavefront detection by high-precision imaging systems is represented by point diffraction interferometry, the basic principles of which are described in the relevant specialist literature—see, for example, D. Malacara, "Optical Shop Testing", Chapter 3.7, John Wiley, New York, 1991. Specific discussions are provided in Patent Specifications U.S. Pat. No. 6,344,898 B1 and U.S. Pat. No. 6,312,373, and in the Laid-Open Specifications JP 11-142291 and WO 02/42728.

In the case of modern high-precision imaging systems of high numerical aperture, used as microlithographic projection objectives, for example, the influence of the imaging system on the state of polarization of the radiation used can scarcely be neglected any longer. Thus, for example, polarization-induced effects on the image quality are produced by birefringence in the case of lenses made from calcium fluoride such as are frequently used for short wavelengths, and by polarization effects at deflecting mirrors. There is therefore a need to be able to determine the influencing of the state of polarization of optical imaging systems of high aperture as well as possible in quantitative terms, in order to draw conclusions on the polarization-dependent image quality.

The invention is based on the technical problem of providing a novel method and a novel apparatus of the type mentioned at the beginning, as well as a polarization analyser arrangement which can be used in this case, with the aid of which the influencing, caused by an optical system under test, of the state of polarization of the radiation used and/or an aberration correction can be determined comparatively accurately such that they are also suitable, in particular, for determining the polarization-induced influence on the imaging quality very precisely in the case of optical imaging systems.

SUMMARY OF THE INVENTION

The invention solves this problem by providing a method for determining the influencing of the state of polarization of optical radiation by an optical system under test, in which entrance-side radiation with a defined entrance state of polarization is directed onto the optical system, the exit state of polarization is measured by radiation emerging from the optical system, and the influencing of the state of polarization by the optical system is determined by means of evaluating the measured exit state of polarization with reference to the entrance state of polarization, wherein the influencing of the state of polarization caused by an optical imaging system of prescribable aperture is determined with pupil resolution.

In a further aspect the invention solves this problem by providing a method for image correction, wherein the distortion of a pupil image by an optical imaging system of prescribable aperture is determined by means of optical computation or measurement acquisition or a combination of the two, and corrected compurationally. This image correction can be used in the method for determining the influencing of the state of polarization of optical radiation by an optical system under test according to the present invention.

The invention is further directed to an apparatus for determining the influencing of the state of polarization of optical radiation by an optical system under test, having means for providing entrance-side radiation, directed onto the optical system, with a defined entrance state of polarization, polarization detector means for measuring the exit state of polarization of radiation emerging from the optical system, and an evaluation unit for determining the influencing of the state of polarization by the optical system by means of evaluating the measured exit state of polarization with reference to the entrance state of polarization, wherein the polarization detector means are set up to measure the exit state of polarization with pupil resolution, and the evaluation unit is set up to determine the influencing of the state of polarization with pupil resolution.

As a yet further aspect the present invention provides for a polarization analyser arrangement comprising a periodic structure, a beam-shaping unit, a compensator polarizer unit, and a polarization analyser element, in particular a polarization beam splitter element.

In addition the present invention provides for a polarization analyser arrangement comprising a beam-shaping unit, a compensator polarizer unit which comprises a plurality of compensator elements which are fixedly arranged with directions of polarization rotated relative to one another, and a polarization analyser element, in particular a polarization beam splitter element.

The polarization analyser arrangement of the present invention can be used as polarization detector or polarizer means in the apparatus for determining the influencing of the state of polarization of optical radiation by an optical system under test.

The method and the apparatus according to the present invention may be used for testing optical imaging systems of prescribable aperture whose influencing of the state of polarization is determined with pupil resolution. Here, the term "with pupil resolution" is to be understood as an angle-resolved determination of this influencing of the state of polarization over at least a portion of the pupil range, given by the aperture, of the optical imaging system.

The determination of the influencing of the state of polarization is therefore performed with pupil resolution for the individual coordinate points of the pupil range under consideration, and not as a purely integral measurement without spatial resolution. This permits the optical imaging system to be tested with pupil resolution for possible optical aberrations which are caused by the influencing of the state of polarization. An important field of application is testing of aberrations in the case of high-precision projection objectives of microlithography projection exposure machines for wafer exposure in the fabrication of semiconductor components, where very fine structures are to be transferred to a wafer from a mask, for example with the aid of UV radiation.

In a development of the method a defined entrance state of polarization is provided in the object plane of the imaging system, and the exit state of polarization is measured with pupil resolution within a prescribable pupil range of the imaging system.

A further development of the method provides as entrance-side radiation a spatially incoherent point light radiation emanating from the object plane of the imaging system. Suitable for this purpose is an apparatus which is further developed according to the invention and comprises a perforated mask with one or more openings in the object plane of the imaging system and upstream first polarization means. The latter can include, in a development of the apparatus according to the invention, a polarizer unit and/or a compensator unit in serial arrangement, which can be set to various spatial orientations. This can be implemented by using rotatable polarizers and/or compensators or using different optical channels, which can be switched in, with preset polarizer/compensator units. In a further refinement, the apparatus can include a diffusing screen in front of the first polarization means.

A further developed apparatus has as polarization detector means a CCD detector and upstream second polarization means. The polarization detector means thus designed permit the simultaneous measurement, with pupil resolution, of the exit state of polarization for all spatial coordinates of the pupil range under consideration in a single measuring operation without the need for alternatively possible scanning of the pupil range by a detector measuring in a punctiform fashion.

The evaluation of the exit state of polarization within the inventive method may include a determination of the phase-reduced Jones matrix from an ellipsometric measurement of the influencing of the state of polarization.

In a further embodiment of the inventive method the pupil-resolved, spatial characteristic of the exit-side wavefront phase is determined by means of shearing interferometry or point-diffraction interferometry. In conjunction with a determination of the phase-reduced Jones matrix it is possible therefrom to determine the complete, pupil-resolved Jones matrix of the optical imaging system. In this case, the polarization detector means of the apparatus carrying out the method have a corresponding shearing or point-diffraction interferometer unit in a corresponding development of the invention.

In a further embodiment of the inventive method the radiation obtained on the exit side by shearing interferometry or point-diffraction interferometry is combined with a polarization analysis for pupil-resolved determination of modulus and phase of the matrix elements of the Jones matrix.

The image correction method of the invention allows to use a relatively simple, cost-effective detection-side optics. The method is suitable in this case, both in conjunction with the inventive measures for determining the influencing of the state of polarization by an optical system and, independently thereof, for any other applications in which a correction of pupil image distortion is desirable. In particular, the method can also come into use in measurement systems which acquire wavefronts such as the above-mentioned OI system, including in system variants taking no account of influences of polarization.

The evaluation unit of the apparatus carrying out the method is, in an embodiment of the invention, appropriately designed for carrying out the method variants with determination of the phase-reduced or complete, pupil-resolved Jones matrix.

The polarization analyser arrangement in accordance with the invention is suitable, in particular, for use as polarization detector means or polarization preparation means in the determination according to the invention of the influencing of the state of polarization of optical radiation by an optical system under test. In advantageous refinements, the arrangement includes a beam-shaping optics composed of one or more spherical and/or aspheric refractive lenses, one or more diffractive lenses, one or more spherical and/or aspheric mirror elements, or a combination of the said optical elements. In one embodiment, there is located in front of the beam-shaping optics a periodic structure with the aid of which it is possible, for example, to implement the measurement acquisition of a pupil image distortion.

Depending on the requirements, it is possible to arrange the periodic structure such that it is coupled to a detector element, arranged after the polarization analyser element, such that it moves laterally therewith, or to hold the periodic structure and the detector element such that they can move relative to one another laterally without such a coupling.

BRIEF DESCRIPTION OF THE DRAWINGS

Advantageous embodiments of the invention are illustrated in the drawings and described in more detail below. In the drawings.

DETAILED DESCRIPTION OF THE PREFERRED EMBODIMENTS

Figure 1:
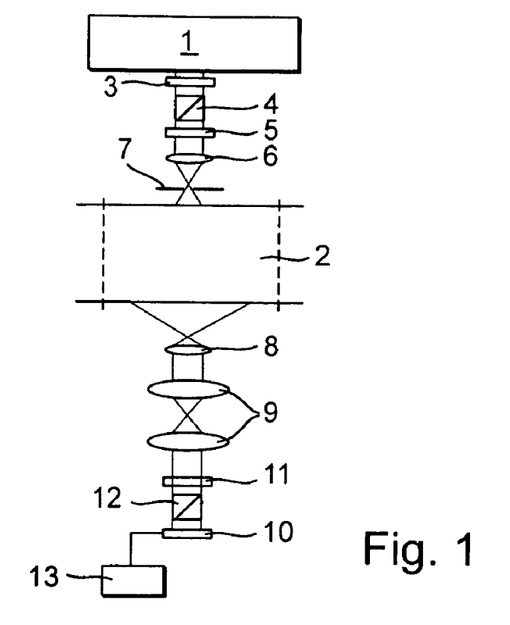
FIG. 1 shows a diagrammatic side view of a microlithography projection exposure machine having an assigned apparatus for determining the influencing of the state of polarization by a projection objective by means of ellipsometric measurement.

FIG. 1 shows a diagram of the design of a microlithography projection exposure machine having an assigned apparatus for determining the influencing of the state of polarization by the imaging part of the system. The projection exposure machine includes in the usual way an illuminating system 1 as that part of the system which supplies the desired radiation, for example UV radiation in the wavelength region of about 248 nm or 193 nm, and a downstream projection objective 2 as imaging part of the system. The design, which is so far conventional, is expanded by components of an apparatus with the aid of which the influencing, caused by the projection objective 2, of the state of polarization of the optical radiation used is supplemented by a so-called numerical aperture (NA) measurement technology with the aid of an ellipsometer function. This apparatus is specifically suitable for determining the phase-reduced Jones matrix in a spatially resolved fashion over the pupil range of the projection objective 2, in the case of which an optical imaging system with a comparatively high aperture is involved.

The apparatus includes between the illuminating system 1 and projection objective 2 means for providing entrance-side radiation for the projection objective 2 with a defined entrance state of polarization. These means include, one behind another in the beam path, a diffusing screen 3, a rotatable polarizer 4, a rotatable compensator 5 (optional), a spot lens and a so-called pinhole or perforated mask 7 having one or more openings. Spatially incoherent radiation is provided to a sufficient extent by the diffusing screen 3, which is of a sufficiently strongly scattering design. The perforated mask 7 is arranged in the focal plane of the spot lens 6, which is illuminated homogeneously to a very large extent and simultaneously forms the object plane of the projection objective 2. This yields a point light source, which is incoherent spatially as far as possible, in the object plane. Downstream of the projection objective 2 is a microscope objective 8 whose focal plane coincides with the image plane of the projection objective 2 and has a numerical aperture which is at least as large as that of the projection objective 2 under test. The microscope objective 8 thus images an object point in the plane of the perforated mask 7 to infinity, that is to say into a real parallel beam path. A sharp image of the intensity distribution of the parallel beam is produced on a detector element 10 by a suitable low-aperture relay optics 9, for example a $4f$ optics, the said detector element being, for example, a CCD chip or imaging camera.

To this extent, the abovementioned components form an NA measurement apparatus with the aid of which the transmission of the projection objective 2 can be determined in a spatially resolved fashion over the entire pupil range in conjunction with a known, prescribed angle-dependent emission of the spot lens/perforated mask unit 6, 7, and with a known, prescribed angle-dependent transmission of the microscope/relay optics unit 8, 9. The emission distribution of the illumination can be determined, for example, in advance by angularly variable scanning by means of a measuring diode suspended goniometrically. The microscope unit can be calibrated by rear transillumination with the aid of a parallel beam of known intensity distribution and, again, by scanning the focal aperture cone with a goniometric measuring apparatus. The scanning method with a goniometric measuring apparatus is certainly also possible per se for the testing, presently of interest, of the projection objective 2, but the advantage of the mode of procedure described here is that an apparatus thus calibrated can be used to measure many field points of the projection objective 2 virtually simultaneously or in any case in a relatively short time.

By adding suitable optical polarization components, this NA measuring apparatus reacquires an ellipsometer function which permits the phase-reduced Jones matrix for the projection objective 2 to be determined in a pupil-resolved fashion. This purpose is served, firstly, by the rotatable polarizer 3 and the rotatable compensator 5 on the entrance or illuminating side of the projection objective 2 and, secondly, by an exit-side rotatable compensator 11 and, downstream thereof, an exit-side polarizer 12 between the relay optics 9 and the CCD detector 10. The calibration of the illuminating part 6, 7 and of the microscope unit 8 can be performed by goniometrically scanning the relevant aperture cone by means of a conventional ellipsometer unit. In this case, the associated parallel beam paths through the polarizer and compensator arrangement are prescribed as at least four linearly independently states of polarization.

Specifically, it is then possible to set consecutively on the illuminating side four different states of polarization which correspond to four linearly independent Stokes vectors, and on the output side the resulting Stokes vectors of the radiation transmitted by the projection objective 2 can be measured. In accordance with known relationships, the entrance-side and exit-side Stokes vectors yield the Muller matrix from which, in turn, the phase-reduced Jones matrix can be derived, as is known from the relevant literature.

This evaluation is performed by an evaluation unit 13, which is shown only diagrammatically in FIG. 1 coupled to the CCD detector 10 and is suitably designed for this purpose. The apparatus assigned to the projection exposure machine with illuminating system 1 and projection objective 2 therefore permits a simultaneous two-dimensional determination of the phase-reduced Jones matrix in a pupil-resolved fashion, that is to say the elements of the Jones matrix, and thus the polarizing property of the projection objective 2, are determined in a spatially resolved fashion over the pupil range of the high-aperture projection objective 2 as a function of the pupil coordinate.

The influence of the projection objective 2 on the state of polarization of the exposure radiation directed onto a wafer can thereby be determined quickly and accurately. In the case of modern microlithographic projection objectives with a high numerical aperture, this influence is gaining in importance, for example because of birefringence effects in the calcium fluoride lenses used for short wavelengths, and because of polarization effects owing to deflecting mirrors. The spatially resolved knowledge of these influences of the projection objective on the state of polarization of the radiation can then be used suitably for the purpose of obtaining a desired imaging/exposure behaviour of the projection exposure machine.

Figure 2:
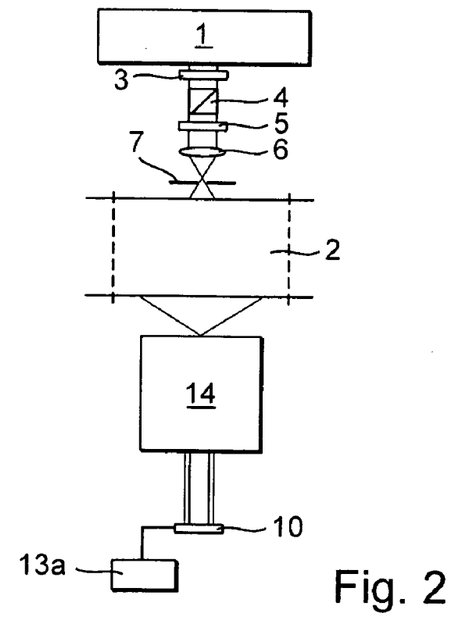
FIG. 2 shows an illustration of a microlithography projection exposure machine corresponding to FIG. 1, but having an apparatus variant for determining the influencing of the state of polarization, which includes a shearing interferometer unit.

FIG. 2 shows a variant of the arrangement of FIG. 1, the same reference symbols being selected, for the sake of simplicity, for functionally identical elements, and it being possible to this extent to refer to the above description of the example of FIG. 1. In particular, the example of FIG. 2 is concerned with a microlithography projection exposure machine having an illuminating system 1 and projection objective 2 whose polarizing property is under test with the aid of an assigned apparatus, the design between the illuminating system 1 and projection objective 2 corresponding to that of FIG. 1.

As mentioned, the apparatus of FIG. 1 is used to determine the pupil-resolved Jones matrix in a phase-reduced fashion, that is to say up to a global phase term dependent on pupil location. The apparatus used in the exemplary embodiment of FIG. 2 is capable of determining this global phase term by means of a shearing interferometry measuring technique in conjunction with a defined entrance state of polarization. Accordingly, this apparatus includes on the exit side of the projection objective 2 under test a shearing interferometer unit 14 to which the CCD detector 10 is connected. A suitably designed evaluation unit 13a is coupled to the latter.

Figure 3:
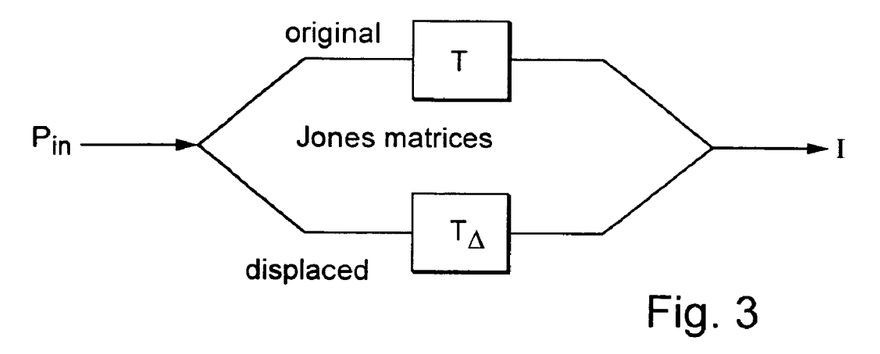
FIG. 3 shows a diagrammatic illustration for explaining two-beam interferometry in the Jones matrix calculus, as it forms a basis of the mode of operation of the apparatus in accordance with FIG. 2.

The shearing interferometer unit is of a conventional design per se, for example as is described in the abovementioned DE 101 09 929 A1 and in the prior German Patent Application 102 17 242.0, likewise mentioned above, to which reference can be made for further details. The required control and evaluation processes are implemented in the evaluation unit 13a, as is evident straight away to the person skilled in the art from the present description of the associated process steps. The basic two-beam interferometry in the Jones matrix calculus is illustrated diagrammatically by way of example in FIG. 3. This yields the exit-side radiation intensity for the superimposition of two fields which are represented by an original Jones matrix T and a Jones matrix $T_\Delta$ displaced by $\Delta x$, from the trace formation of a matrix product of the sum matrix $T+T_{66}$ by the entrance polarization matrix $P_{in}$, and the hermite conjugate sum matrix $(T+T_{66})^+$. If the original and the displaced Jones matrix T and $T_{66}$, respectively, are known up to a constant phase factor, their phase difference $\alpha\Delta$ can be determined from the relationship $$\exp[i\Delta\alpha] = Q/\text{trace}[\hat{T}P_{in}\hat{T}_\Delta^+],$$

with $Q=\text{trace } [TP_{in}T_\Delta^+]$ and $\hat{T}=\exp[i\Delta]\cdot T$ as well as $\hat{T}_{66}=\exp[-i(\alpha+\Delta\alpha)]\cdot T_\Delta$ denoting the phase-reduced original and displaced Jones matrix, respectively. The generally complex number Q can be obtained by measurement with the shearing interferometer unit 14 from the amplitude and phase of the modulation signal while using the phase shift technique. Since the use of shearing interferometry currently being considered permits the use of the same radiation which is used in the actual useful operation of the polarization objective 2, this measurement technology is also denoted as operational interferometer (OI) measurement technology.

The spatial characteristic of the phase $\alpha(x)$ over the pupil coordinate x can then be determined by an integration. This permits the determination of the complete Jones matrix for the protection objective 2, when the phase-reduced Jones matrix is already known, for example from the ellipsometric NA measurement with the aid of the apparatus of FIG. 1. The only precondition is that the state of polarization of the illumination, that is to say on the entrance side of the projection objective 2, is completely known in the case of the OI measurement of FIG. 2, and in this case it can also be entirely unpolarized. In the example of FIG. 2, the defined, completely polarized entrance-side state of radiation is effected by the use of the entrance-side polarizer 4 and the optional entrance-side compensator 5.

Since the individual Jones matrix elements cannot be inferred from the complex number $Q=\text{trace}(TP_{in}T_A^+)$ as such, the apparatus in accordance with FIG. 2 is not capable alone of determining the phase-reduced Jones matrix. By contrast, this is rendered possible by the arrangement in accordance with FIG. 4 which, by contrast with that of FIG. 2, is modified to the effect that a rotatable polarizer 15 is provided between the shearing interferometer unit 14 and the CCD detector 10. For this purpose, the optional entrance-side compensator of the example of FIG. 2 is dispensed with in the example of FIG. 4. Otherwise, the two exemplary embodiments are of corresponding design.

Figure 4:
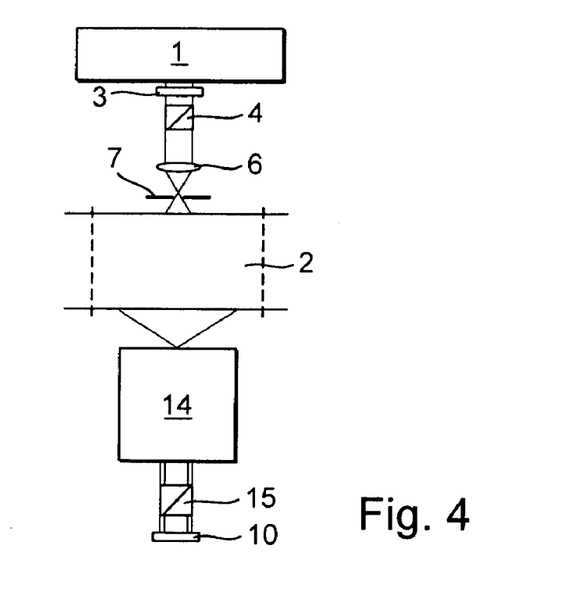
FIG. 4 shows an illustration of a microlithography projection exposure machine corresponding to FIG. 2, but for an apparatus variant having additional polarization analyser means on the exit side of the shearing interferometer unit.

In the case of the apparatus of FIG. 4, the individual elements of the Jones matrix can be projected out by the entrance-side rotatable polarizer 4 and the exit-side rotatable polarizer 15. The value $T_{xx}T_{Axx}^+$ thus results for the trace Q given entrance- and exit-side setting of a state linearly polarized in the x direction. Using the formulation $T_{xx}=a \cdot \exp[i\phi]$ for the matrix element $T_{xx}$, this yields the relationship $$Q=a(a+\Delta a)\exp[-i\Delta\phi]$$

for the trace value Q, which can be determined by measurement with the shearing interferometer unit 14, and thus a differential expression for the modulus $a(a+\Delta a)$ and the phase $-i\Delta\phi$, so that the Jones matrix element $T_{xx}$ can be determined by numerical integration over the pupil coordinate. The phase surface $\phi$ is determined in this case only up to an integration constant which is the same for all pupil locations.

In the same way, the other matrix components $T_{yx}$, $T_{xy}$ and $T_{yy}$, and thus the entire phase-reduced Jones matrix, can be determined by setting an entrance or exit state which is linearly polarized in the y direction. The four Jones matrix elements are determined in modulus and phase as a function of the pupil coordinates, but the four associated phase surfaces have no defined relationship to one another, because their integration constants are not known. This can be remedied, for example, by carrying out for at least one point of the pupil range an ellipsometric measurement whose measurement result yields the missing relationship between the four phase surfaces. A measurement with the aid of a commercial, single-axis ellipsometer, for example along the optical axis of the projection objective 2, suffices for this purpose.

Figure 5:
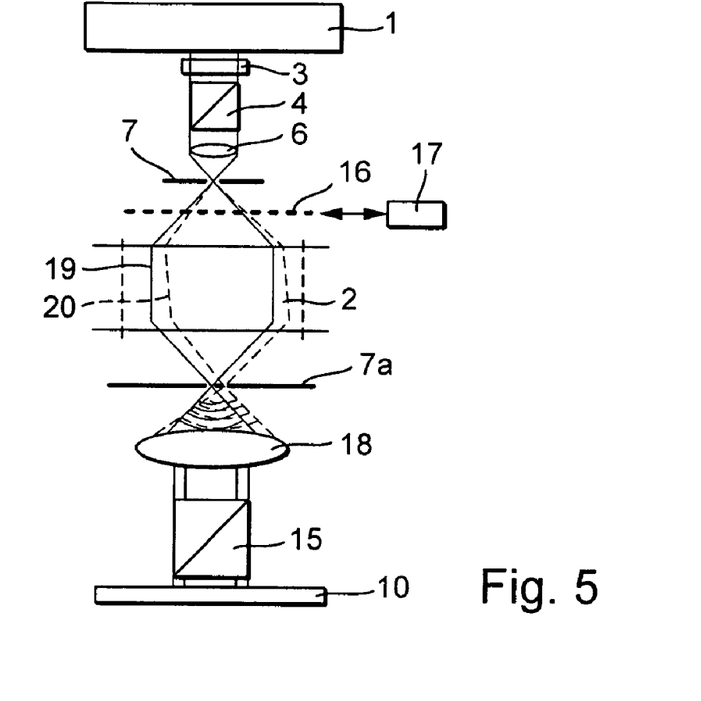
FIG. 5 shows an illustration of a microlithography projection exposure machine corresponding to FIG. 2, but for an apparatus variant which operates as a point-diffraction interferometer having additional polarization analyser means.

Instead of a shearing interferometer, it is also possible to make use of a point-diffraction interferometer equipped with appropriate polarization analyser means for the purpose of measuring the complete Jones matrix in a completely pupil-resolved fashion. FIG. 5 shows an advantageous embodiment of such an interferometer. In addition to the components used in FIG. 4, use is made in the point-diffraction interferometer of a diffraction grating 16 which, by means of a diffraction effect, splits the spherical wave produced by the pinhole mask 7 into various component waves which are indicated here by two beam paths 19 and 20. The two component waves traverse the projection objective 2 on similar trajectories and are subsequently converted into a test wave and a reference wave by focusing onto pinholes of different size of a corresponding pinhole mask 7a. Because of the coherence of the two component waves, an interferogram of the entire objective aperture is produced which is imaged onto the CCD detector 10 with the aid of a beam shaping apparatus 18. By analogy with the method using a shearing interferometer of FIG. 4, this interferogram can be combined with polarization analysis means, such as the polarizer 15 shown, in order to obtain polarization-dependent wavefronts and thus, by analogy with the method with a shearing interferometer, to obtain the Jones matrix of the projection objective. The method of phase shifting can also be applied in the case of the point-diffraction interferometer for the purpose of raising the accuracy of phase measurement, and this is indicated by an actuating unit 17.

FIGS. 6 to 10 show various polarization analyser arrangements which can be used as polarization detection part in the apparatuses of FIGS. 1, 2, 4 and 5, but which can also be used there on the object side for the purpose of preparing a desired, defined state of polarization, in this case without a detector element, and moreover in any desired other apparatuses in which there is a need to measure the state of polarization in a spatially or pupil-resolved fashion.

Figure 6:
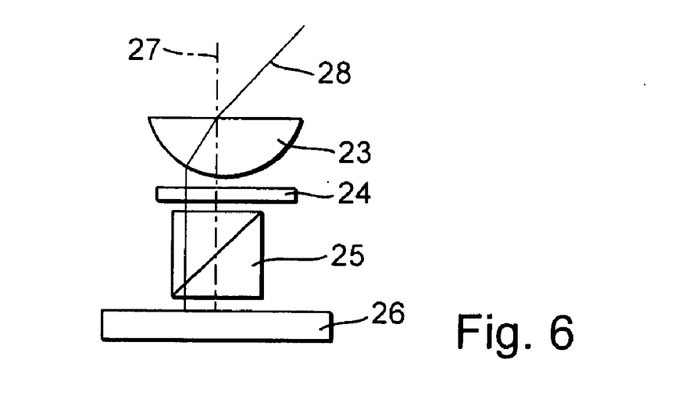
FIG. 6 shows a diagrammatic side view of a polarization analyser arrangement which can be used as polarization detector means, for example in apparatuses of the type of FIGS. 1, 2, 4 and 5.

Specifically, the analyser arrangement shown in FIG. 6 comprises in the direction of light incidence from top to bottom one after another a beam-shaping lens unit in the form of a convex lens 23, a polarizer unit or a compensator in the form of a lambda/4-plate 24, a polarizer 25, for example in the form of a polarization beam splitter element such as a polarization splitter cube, and a flat detector element 26 which can, in particular be a CCD image sensor of an imaging camera. The optical axis 27 of the system and the course of an obliquely incident light beam 28 are also illustrated.

In conjunction with a polarizer element arranged on the object side, for example in the object plane or reticle plane of a lithography objective to be tested, the analyser arrangement of FIG. 6, designed in such a way, permits the optical system which is to be tested to be measured ellipsometrically in a spatially or pupil-resolved fashion by rotation of the lambda/4-plate 24, and thus permits the influencing of the state of polarization of the said system to be determined.

Figure 7:
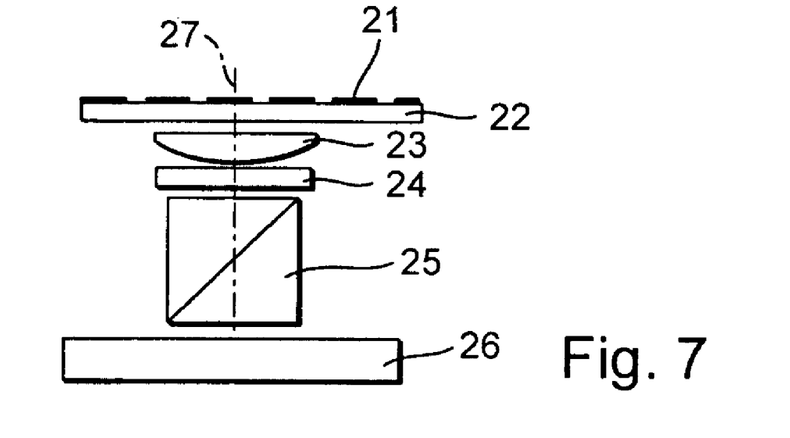
FIG. 7 shows a side view corresponding to FIG. 6 for a variant having an additional periodic structure for the purpose of measurement acquisition of the pupil distortion.

FIG. 7 shows a variant of the analyser arrangement of FIG. 6, functionally equivalent elements being provided with the same reference numerals for the sake of clarity. By contrast with the arrangement of FIG. 6, an additional substrate 22 with a periodic structure 21 is provided on the entrance side in the case of the analyser arrangement of FIG. 7. This periodic structure 21 can be, in particular, a shearing diffraction grating for shearing interferometry measurement. As illustrated in FIG. 7, the structure 21 can be present as an independent substrate detached from a beam-shaping lens unit 23, or the lens unit can, if designed as a plano-convex lens, be wrung or otherwise fastened with the plane side upwards on the substrate 22 of the structure 21. As a further alternative, the structure 21 can be applied directly to the upper plane side of such a plano-convex lens. Whereas the arrangement with a plano-convex lens wrung or fastened on the substrate is particularly suitable for measuring apparatuses in the case of which a common lateral movement of the structure 21 with the detector element 26 is provided during operation, the movement-related decoupling of the substrate 22 with the structure 21 applied thereon, and the lens unit 23 is advantageous for systems in which the structure 21 and the detector element 26 are moved laterally relatively to one another, e.g. only the structure 21 or only the detector element 26.

Figure 8:
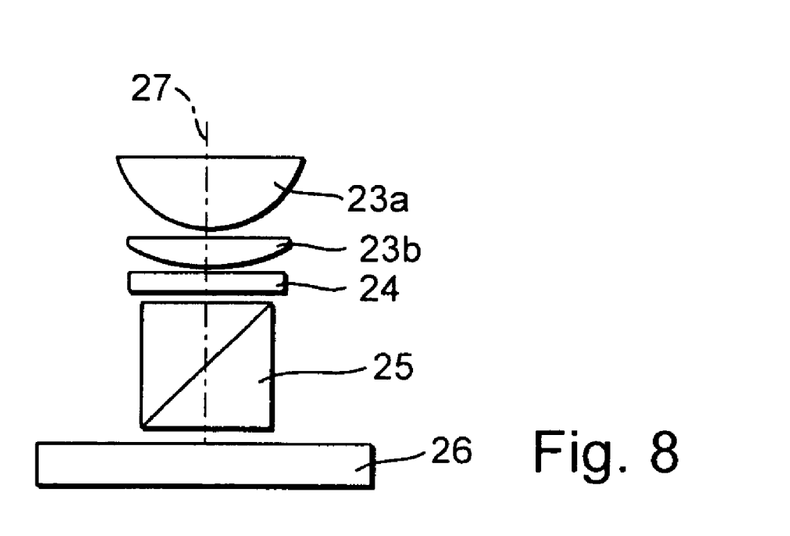
FIG. 8 shows a side view corresponding to FIG. 7 for a variant having two lenses.

The basic concept of the analyser arrangement according to the invention consists in managing with a relatively simple detection optics which deflects the beams so far that they strike the polarization splitter element 25 in such a way that they are sufficiently polarized by it, it being accepted that a distorted pupil image of the objective to be tested occurs in the detection plane 26, something which is compensated by suitable correction measures. An expedient correction measure, in particular for high-aperture optical systems under test, such as high-aperture lithography objectives, consists in a multicomponent design of the detection lens unit. By way of example in this regard, FIG. 8 shows as a further variant an analyser arrangement in which the beam-shaping unit comprises two consecutive, in particular aspheric lenses 23a, 23b. This permits a reduction of the distortion errors and the avoidance of angles of incidence associated with total reflection. In any case, an antireflection coating of the lens element or elements is expedient in addition with high-aperture systems because of the high angles of incidence occurring.

Figure 9:
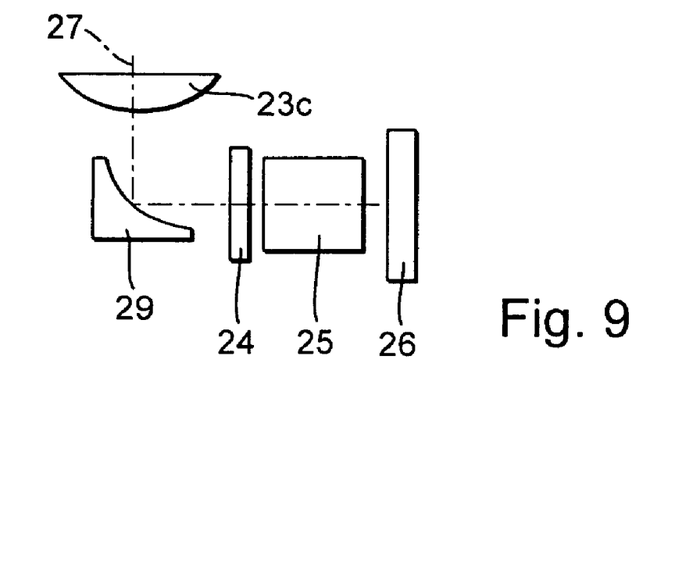
FIG. 9 shows a side view corresponding to FIG. 6 for a variant which contains a mirror element.

FIG. 9 shows a further variant of the analyser arrangement of FIG. 6, one or more refractive optical elements being replaced by a mirror element 29 which follows a convex lens 23c and effects a deflection of the optical axis 27 of the system, for example by 90° as shown. It is also possible here to apply a plurality of mirror elements, and the mirror surfaces can be plane, spherical or aspheric. Advantages of such an arrangement can be, for example, the reduction in overall height, as well as low chromatic aberrations of the arrangement.

Figure 10:
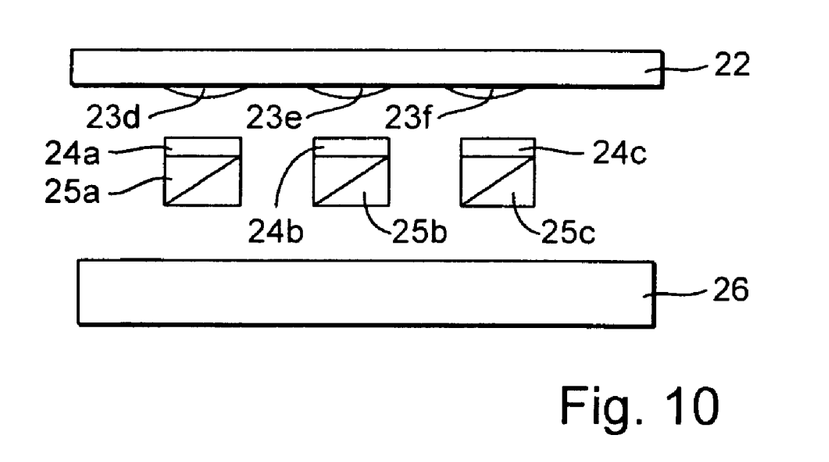
FIG. 10 shows a side view corresponding to FIG. 6 for a variant having a plurality of individual lambda/4 polarizer elements which are permanently arranged with directions of polarization rotated relative to one another.

Whereas in the analyser arrangement of FIGS. 6 to 9, the lambda/4-plate 24 is rotated in operation for the purpose of measuring the ellipsometry angle, FIG. 10 shows a further analyser variant in the case of which a plurality of individual lambda/4 polarizer elements 24a, 24b, 24c, such as individual lambda/4 platelets, with directions of polarization which are rotated in a prescribed relationship to one another as compensator elements, such that no rotation of the same is required during operation. This results in a polarization analyser arrangement which has no actively moving parts. It may be mentioned at this point that an object-side polarizer unit can be constructed in the same way for the ellipsometric measurement of individual, permanently arranged lambda/4 platelets with rotated directions of polarization. The individual lambda/4 platelets 24a, 24b, 24c are fitted on one polarization splitter cube 25a, 25b, 25c each in the example of FIG. 10. Alternatively a plurality of, or preferably all of, the lambda/4-platelets can be fixed together on a polarization splitter cube. For the individual channels thus formed, the lens unit is designed in a fashion to match this from a field of individual lenses 23d, 23e, 23f which are fixed on the underside of the substrate in the example of FIG. 10.

As to the type of the lenses used in the detection lens unit, as already mentioned in part, depending on requirement, consideration is given, in particular, to one or more simple spherical lenses, one or more aspheric lenses or a diffractive lens. Lens units with a spherical individual lens can be well suited to systems which are to be tested and have relatively small aperture angles. Advantageous for higher numerical apertures are multilens systems, aspheric lenses or diffractive lenses, in order to avoid exceeding the angle of total reflection, and to keep the angles of incidence on the polarization splitter element 25 sufficiently small, since this fulfils its polarization beam splitting function to the required extent only for a relatively narrow range of angles of incidence. Moreover, the pupil resolution generally decreases strongly towards the edge.

Figure 11:
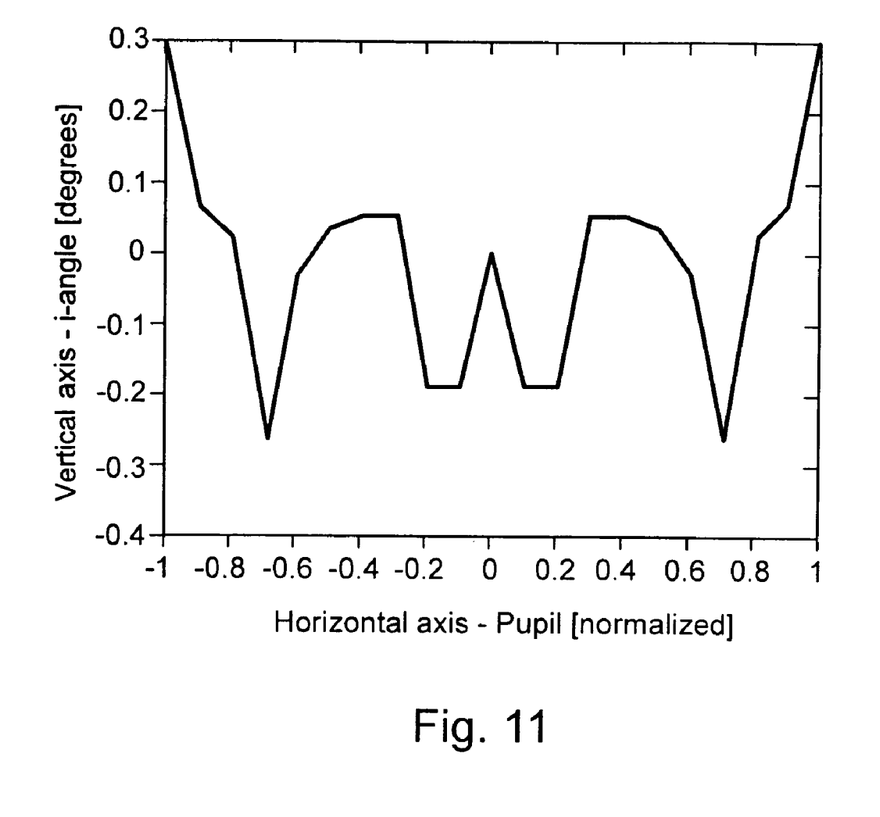
FIG. 11 shows a diagram of the angle of incidence as a function of the pupil for a typical optics of a polarization analyser arrangement according to the type of FIGS. 6 to 10.

FIG. 11 illustrates for this purpose in a characteristic diagram a typical characteristic of the angle of incidence (i angle) as a function of the pupil. The pupil distortion error already mentioned above can be reduced by using one or more aspheric lenses or a diffractive lens instead of a spherical lens. A diffractive lens can be implemented, for example, by forming a corresponding diffractive structure on the underside of the substrate 22 bearing the periodic structure 21 on its top side. The grating period of this diffractive structure is adapted locally such that the beam is deflected in accordance with its aperture angle. In order to avoid interactions between various channels, the spacing of the polarization splitter element or elements is/are selected such that the undesired diffraction orders do not lie in the acquisition range of the polarization splitter element or elements. To give a numerical example, typical grating periods of the order of magnitude of 230 nm are yielded for a numerical aperture of 0.85 and an optical wavelength of 193 nm.

In addition to and independently of the above-named lens-side measures, which serve the purpose of keeping the angles of incidence and the distortion errors as low as possible, the distorted pupil image, produced on the detector plane 26, of the optical system under test is suitably compensated or corrected in the evaluation section connected to the detector element 26. This distortion correction can be performed by means of optical computing methods, for example ray tracing, or by measurement determination of the distortion of the pupil image at the optical system designed. The following measuring methods can be used, inter alia: imaging of reference patterns in the pupil of the projection objective on the detector element 26, moiré technique, phase difference measurement or comparison of interference fringes with computational desired positions on the detector element 26 in conjunction with a fixed or variable focal position of the polarization analyser arrangement. These methods are techniques known per se which therefore do not require explanation in more detail here. These techniques can be used to obtain the information which is required for correcting the distortion of the pupil image in the detector plane, such as the corresponding pupil image interferograms.

The implementation of the above-named measurement methods is served by the use of the periodic structure 21. The combination of optical computation and measurement acquisition with the aim of correcting the pupil image is possible.

With the aid of this correction measure on the evaluation side, it is not mandatory to make use on the detection side of a microscope objective which ensures a shear distance which is constant over the entire detection field of the detector element 26. Instead of this, it is possible to use a simple detection optics in which the sine condition is not fulfilled. The effect of such non-optimal imaging by the detection-side optics is determined by optical computing methods, for example ray tracing, or by phase difference measurement, and taken into account correctively in evaluating the pupil image interferogram. A similar statement holds for the distortion errors which are caused by a non-optimal adjustment of the optics. The same holds for pure wavefront measurements without any arrangement of polarization analysers in which no beam-shaping optical systems at all are used for pupil imaging.

As the exemplary embodiments explained above make clear, the invention permits a very accurate and quick determination of the influencing of the state of polarization of radiation with acceptable outlay by an imaging system with the aid of NA measurement technology in combination with ellipsometry and/or by using a shearing interferometer technique with or without an exit-side polarization analyser. In this case, the invention performs, in particular, a pupil-resolved determination of the influencing of the state of polarization as a function of the pupil coordinate even for high-aperture imaging systems such as modern projection objectives of microlithography projection exposure machines. It goes without saying that, in addition to such projection objectives, the invention can also be applied for any other desired optical imaging systems whose influence on the state of polarization is to be detected in a spatially resolved fashion.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall with the spirit and scope of the invention, as defined by the appended claims, and equivalents thereof.

What is claimed is:

1. A method for determining the influencing of the state of polarization of optical radiation by an optical system, comprising
    directing entrance-side radiation with a defined entrance state of polarization onto the optical system,
    measuring the exit state of polarization by radiation emerging from the optical system, and
    determining the influencing of the state of polarization by the optical system by means of evaluating the measured exit state of polarization with reference to the entrance state of polarization,
    wherein the influencing of the state of polarization caused by the optical system of prescribable aperture is determined with pupil resolution; and
    wherein an associated ellipsometric measurement is carried out;
    wherein the optical system is a microlithography objective.

2. A method according to claim 1, wherein the defined entrance state of polarization is provided in an object plane of the optical system, and the exit state of polarization is measured with pupil resolution within a prescribable pupil range of the optical system.

3. A method according to claim 1, wherein evaluating the measured exit state of polarization includes a determination of the phase-reduced Jones matrix.

4. A method for determining the influencing of the state of polarization of optical radiation by an optical system, comprising
    directing entrance-side radiation with a defined entrance state of polarization onto the optical system,
    measuring the exit state of polarization by radiation emerging from the optical system, and
    determining the influencing of the state of polarization by the optical system by means of evaluating the measured exit state of polarization with reference to the entrance state of polarization,
    wherein the influencing of the state of polarization caused by the optical system of prescribable aperture is determined with pupil resolution;
    wherein an associated ellipsometric measurement is carried out; and
    wherein a spatially incoherent point light radiation emanating from the object plane of the optical system is provided as entrance-side radiation.

5. A method for determining the influencing of the state of polarization of optical radiation by an optical system, comprising
    directing entrance-side radiation with a defined entrance state of polarization onto the optical system,
    measuring the exit state of polarization by radiation emerging from the optical system, and
    determining the influencing of the state of polarization by the optical system by means of evaluating the measured exit state of polarization with reference to the entrance state of polarization,
    wherein the influencing of the state of polarization caused by the optical system of prescribable aperture is determined with pupil resolution; and
    wherein directing entrance side radiation with the defined entrance state of polarization, measuring the exit state of polarization and evaluating the measured exit state of polarization include a shearing interferometric measurement or a point diffraction interferometric measurement.

6. A method according to claim 5, wherein the result of the shearing interferometric measurement or of the point-diffraction interferometric measurement is subjected to a downstream polarization analysis.

7. An apparatus for determining the influencing of the state of polarization of optical radiation by an optical system, comprising:
    means for providing entrance-side radiation, directed onto the optical system, with a defined entrance state of polarization,
    polarization detector means for measuring the exit state of polarization of radiation emerging from the optical system, and
    an evaluation unit for determining the influencing of the state of polarization by the optical system by means of evaluating the measured exit state of polarization with reference to the entrance state of polarization,
    wherein
        the polarization detector means is configured to measure the exit state of polarization with pupil resolution;
        the evaluation unit is configured to determine the influencing of the state of polarization with pupil resolution;
        the means for providing the entrance-side radiation includes a perforated mask in an object plane of the optical system and a first polarization means, upstream from the perforated mask; and
        the first polarization means includes a polarizer unit and/or a compensator unit in serial arrangement, which can be set to various spatial orientations.

8. An apparatus according to claim 7, wherein the means for providing the entrance-side radiation includes a diffusing screen in front of the first polarization means.

9. An apparatus according to claim 7, wherein the polarization detector means includes a CCD detector and a second polarization means, upstream from the CCD detector.

10. An apparatus according to claim 7, wherein the evaluation unit is configured for determining the phase-reduced or complete, pupil-resolved Jones matrix.

11. An apparatus for determining the influencing of the state of polarization of optical radiation by an optical system, comprising:
    means for providing entrance-side radiation, directed onto the optical system, with a defined entrance state of polarization,
    polarization detector means for measuring the exit state of polarization of radiation emerging from the optical system, and
    an evaluation unit for determining the influencing of the state of polarization by the optical system by means of evaluating the measured exit state of polarization with reference to the entrance state of polarization,
    wherein
        the polarization detector means is configured to measure the exit state of polarization with pupil resolution;
        the evaluation unit is configured to determine the influencing of the state of polarization with pupil resolution;
        the means for providing the entrance-side radiation includes a perforated mask in an object plane of the optical system and a first polarization means, upstream from the perforated mask; and
        the first polarization means includes a polarizer unit and/or a compensator unit in serial arrangement, which can be set to various spatial orientations
        the polarization detector means includes a shearing interferometer unit or a point-diffraction interferometry unit.

12. A method for determining the influencing of the state of polarization of optical radiation by an optical system, comprising:
    directing entrance-side radiation with a defined en-trance state of polarization onto the optical system,
    measuring the exit state of polarization by radiation emerging from the optical system, and
    determining the influencing of the state of polarization by the optical system by means of evaluating the measured exit state of polarization with reference to the entrance state of polarization,
    wherein the influencing of the state of polarization caused by the optical system of prescribable aperture is determined with pupil resolution; and
    wherein a spatially incoherent point light radiation emanating from the object plane of the optical system is provided as entrance-side radiation.

13. A method according to claim 12, wherein the defined entrance state of polarization is provided in an object plane of the optical system, and the exit state of polarization is measured with pupil resolution within a prescribable pupil range of the optical system.

14. A method according to claim 12, wherein evaluating the measured exit state of polarization includes a determination of the phase-reduced Jones matrix; and
    an associated ellipsometric measurement is carried out.

15. A method for determining the influencing of the state of polarization of optical radiation by an optical system, comprising:
    directing entrance-side radiation with a defined en-trance state of polarization onto the optical system,
    measuring the exit state of polarization by radiation emerging from the optical system, and
    determining the influencing of the state of polarization by the optical system by means of evaluating the measured exit state of polarization with reference to the entrance state of polarization,
    wherein the influencing of the state of polarization caused by the optical system of prescribable aperture is determined with pupil resolution;
    wherein a spatially incoherent point light radiation emanating from the object plane of the optical system is provided as entrance-side radiation; and
    wherein directing entrance side radiation with the defined entrance state of polarization, measuring of the exit state of polarization and evaluating the measured exit state of polarization include a shearing interferometric measurement or a point diffraction interferometric measurement.

16. A method according to claim 15, wherein the result of the shearing interferometric measurement or of the point-diffraction interferometric measurement is subjected to a downstream polarization analysis.

17. An apparatus for determining the influencing of the state of polarization of optical radiation by an optical system, comprising:
    means for providing entrance-side radiation, directed onto the optical system, with a de-fined entrance state of polarization,
    polarization detector means for measuring the exit state of polarization of radiation emerging from the optical system, and
    an evaluation unit for determining the influencing of the state of polarization by the optical system by means of evaluating the measured exit state of polarization with reference to the entrance state of polarization,
    wherein
        the polarization detector means are configured to measure the exit state of polarization with pupil resolution;
        the evaluation unit is configured to determine the influencing of the state of polarization with pupil resolution; and
        the means for providing the entrance-side radiation includes a perforated mask in an object plane of the optical system and a first polarization means, upstream of the perforated mask.

18. An apparatus according to claim 17, wherein the means for providing the entrance-side radiation includes a diffusing screen in front of the first polarization means.

19. An apparatus according to claim 17, wherein the polarization detector means includes a CCD detector and a second polarization means upstream from the CCD detector.

20. An apparatus according to claim 17, wherein the evaluation unit is configured for determining the phase-reduced or complete, pupil-resolved Jones matrix.

21. An apparatus for determining the influencing of the state of polarization of optical radiation by an optical system, comprising:
    means for providing entrance-side radiation, directed onto the optical system, with a de-fined entrance state of polarization,
    polarization detector means for measuring the exit state of polarization of radiation emerging from the optical system, and an evaluation unit for determining the influencing of the state of polarization by the optical system by means of evaluating the measured exit state of polarization with reference to the entrance state of polarization,
wherein
the polarization detector means are configured to measure the exit state of polarization with pupil resolution;
the evaluation unit is configured to determine the influencing of the state of polarization with pupil resolution; and the means for providing the entrance-side radiation includes a perforated mask in an object plane of the optical system and a first polarization means, upstream of the perforated mask; and
the polarization detector means includes a shearing interferometer unit or a point-diffraction interferometry unit.

* * * * *